(12) United States Patent
Isoda et al.

(10) Patent No.: US 11,035,055 B2
(45) Date of Patent: Jun. 15, 2021

(54) GROUP 13 NITRIDE LAYER, COMPOSITE SUBSTRATE, AND FUNCTIONAL ELEMENT

(71) Applicant: NGK INSULATORS, LTD., Nagoya (JP)

(72) Inventors: Yoshinori Isoda, Ichinomiya (JP); Suguru Noguchi, Nagoya (JP); Tetsuya Uchikawa, Nagoya (JP); Takayuki Hirao, Nisshin (JP); Takanao Shimodaira, Nagoya (JP); Katsuhiro Imai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 85 days.

(21) Appl. No.: 16/385,380

(22) Filed: Apr. 16, 2019

(65) Prior Publication Data
US 2019/0242029 A1 Aug. 8, 2019

Related U.S. Application Data

(63) Continuation of application No. PCT/JP2017/035537, filed on Sep. 29, 2017.

(30) Foreign Application Priority Data

Oct. 28, 2016 (JP) .............. JP2016-211564

(51) Int. Cl.
| | |
|---|---|
| *C30B 29/40* | (2006.01) |
| *H01L 33/00* | (2010.01) |
| *H01L 33/32* | (2010.01) |
| *C30B 29/38* | (2006.01) |
| *H01L 21/205* | (2006.01) |
| *C30B 25/02* | (2006.01) |

(52) U.S. Cl.
CPC ............ *C30B 29/406* (2013.01); *C30B 29/38* (2013.01); *H01L 21/205* (2013.01); *H01L 33/0075* (2013.01); *H01L 33/32* (2013.01); *C30B 25/02* (2013.01)

(58) Field of Classification Search
CPC ....... C20B 29/406; C20B 29/38; C20B 25/02; H01L 21/205; H01L 33/0075; H01L 33/32
See application file for complete search history.

(56) References Cited

U.S. PATENT DOCUMENTS

| | | | |
|---|---|---|---|
| 8,349,076 B2 | 1/2013 | Song et al. | |
| 9,045,844 B2 | 6/2015 | Iwai et al. | |

FOREIGN PATENT DOCUMENTS

| | | |
|---|---|---|
| JP | 2007-106666 A1 | 4/2007 |
| JP | 2009-091225 A1 | 4/2009 |
| JP | 2009-091226 A1 | 4/2009 |

(Continued)

OTHER PUBLICATIONS

English Translation of International Preliminary Report on Patentability, International Application No. PCT/JP2017/035537, dated May 9, 2019 (13 pages).

(Continued)

*Primary Examiner* — Seahvosh Nikmanesh
(74) *Attorney, Agent, or Firm* — Burr & Brown, PLLC

(57) ABSTRACT

It is provided a layer of a nitride of a group 13 element having a first main face and second main face. The layer of the nitride of the group 13 element includes a first void-depleted layer provided on the side of the first main face, a second void-depleted layer provided on the side of the second main face, and the void-distributed layer provided between the first void-depleted layer and second void-depleted layer.

8 Claims, 5 Drawing Sheets

(56) References Cited

FOREIGN PATENT DOCUMENTS

| | | |
|---|---|---|
| JP | 2012-126602 A1 | 7/2012 |
| JP | 2013-249230 A1 | 12/2013 |
| JP | 2013-252989 A1 | 12/2013 |
| WO | 2013/021804 A1 | 2/2013 |

OTHER PUBLICATIONS

Kohei Fujita, et a., "HVPE Growth of Thick AlN on Trench-Patterned Substrate," *Phys. Status Solidi C*, 2011, vol. 8, No. 5, pp. 1483-1486.
International Search Report and Written Opinion (Application No. PCT/JP2017/035537) dated Dec. 12, 2017.

200μm

GROUP 13 NITRIDE LAYER, COMPOSITE SUBSTRATE, AND FUNCTIONAL ELEMENT

TECHNICAL FIELD

The present invention relates to a layer of a nitride of a group 13 element, composite substrate and functional device.

BACKGROUND OF THE INVENTION

As a method of producing a self-supporting body composed of gallium nitride single crystal, it is known the method of applying an underlying substrate composed of a different material such as sapphire or GaAs, of growing a thick film of gallium nitride crystal thereon and of then removing the underlying substrate. In this case, as the thermal expansion coefficients of the underlying substrate and gallium nitride are different from each other, a stress is induced during the cooling. As the warping of a composite substrate having the underlying substrate and gallium nitride crystal thus becomes large, cracks tend to occur in the gallium nitride crystal or underlying substrate to lower the yield. Further, as the warping of the composite substrate is large, cracks may occur when the underlying substrate is removed by laser lift-off, for example, providing problems.

According to patent document 1 (Japanese Patent publication No. 2012-126602A), spaces are provided on a surface of a seed crystal substrate to grow a crystal from the spaces, so that a contact area of the seed crystal substrate and grown crystal is reduced and the crystal after the growth is separated utilizing the difference of the thermal expansion in the cooling step.

On the other hand, according to descriptions of patent document 2 (WO 2013/021804 A2), an inclusion-distributed layer with many inclusions (heterogenous phases) is formed along an interface with a seed crystal film so that gallium nitride can be separated without cracks by laser lift-off method.

Further, according to patent documents 3 and 4 (Japanese Patent Publication Nos. 2009-91225A and 2009-91226A), it is proposed to control a temperature or pressure for improving the efficiency of growth of the gallium nitride crystal.

PRIOR TECHNICAL DOCUMENTS

Patent Documents (Patent document 1) Japanese Patent publication No. 2012-126602A
(Patent document 2) WO 2013/021804 A2
(Patent document 3) Japanese Patent Publication No. 2009-91225A
(Patent document 4) Japanese Patent Publication No. 2009-91226A

Object to be Solved by the Invention

However, according to the method of patent document 1, the success ratio of the separation of the gallium nitride crystal is limited and the suppression of the cracks is insufficient.

According the patent document 2, the inclusion-distributed layer is formed on the seed crystal film and an inclusion-depleted layer is formed thereon so that dislocation defects are absorbed at the inclusion-distributed layer to suppress the cracks. However, it is difficult to control the thickness of the inclusion-depleted layer and sizes of the inclusions, so that cracks may occur in the inclusion-depleted layer.

Although patent documents 3 and 4 disclose techniques for improving the growth rate of the gallium nitride crystal, it is not described suppression of the cracks or the like.

SUMMARY OF THE INVENTION

An object of the present invention is to provide a layered structure by which cracks in a layer of a nitride of a group 13 element can be suppressed.

Solution for the Object

The present invention provides a layer of a nitride of a group 13 element, the layer having a first main face and second main face, said layer comprising:
a first void-depleted layer provided on a side of said first main face;
a second void-depleted layer provided on a side of said second main face; and
a void-distributed layer provided between said first void-depleted layer and said second void-depleted layer.

The present invention further provides a composite substrate comprising:
a seed crystal substrate; and
said layer of said nitride of said group 13 element, said layer being provided on a surface of said seed crystal substrate.

The present invention further provides a functional device comprising:
the layer of the nitride of the group 13 element; and
a functional layer provided on the second main face of the layer of the nitride of the group 13 element.

Effects of the Invention

When a layer of a nitride of a group 13 element is formed on a seed crystal substrate, the present inventors reached the idea of providing a three-layered structure, by forming a first void-depleted layer with depleted voids therein first, by then forming a void-distributed layer with many voids formed thereon and by forming a second void-depleted layer again on the void-distributed layer. That is, it is successfully produced a structure in which the first void-depleted layer is provided between the void-distributed layer and the interface of the seed crystal film.

Further, as the thus obtained layer of the nitride of the group 13 element is examined in detail, it is found that cracks can be considerably decreased in the second void-depleted layer. The present invention is thus made.

The reasons are not clear. However, it is found the following. In the case that the layer of the nitride of the group 13 element is cooled, a stress is not concentrated at an interface of the layer of the nitride of the group 13 element and the surface of the seed crystal and is concentrated on a position which is distant from the interface inside of the layer of the nitride of the group 13 element. Then, the void-distributed layer is provided at the position distant from the interface inside of the layer of the nitride of the group 13 element. The stress generated during the cooling can be concentrated in or in the vicinity of the void-distributed layer so that the stress can be relaxed, or the propagation of the cracks can be suppressed by the void-distributed layer. It is thus considered that the cracks in the second void-depleted layer thereon can be suppressed.

BRIEF DESCRIPTIONS OF THE DRAWINGS

FIG. 1(a) is a view schematically showing the state that the seed crystal film 3 is formed on the single crystal substrate 1, FIG. 1(b) is a view schematically showing the state that a first void-depleted layer 4a is provided on the seed crystal film 3, and FIG. 1(c) shows the state that a void-distributed layer 4b is provided on the first void-depleted layer.

FIG. 2(a) is a view schematically showing the state that a second void-depleted layer 4c is provided on the void-distributed layer, and FIG. 2(b) is a view schematically showing a self-supporting body 6 composed of a layer of a nitride of a group 13 element.

DETAILED DESCRIPTION OF THE INVENTION

Figure 1A:
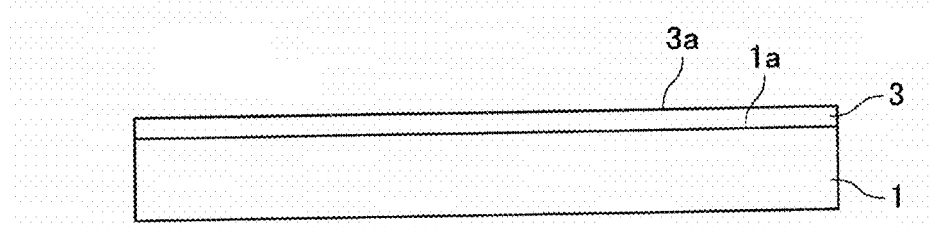

The embodiments of the present invention will be described further below, appropriately referring to the drawings.

Figure 1B:
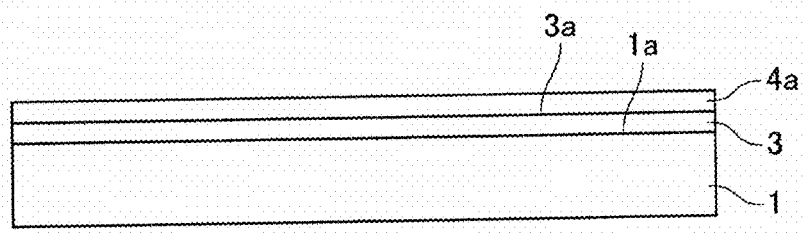
Figure 1C:
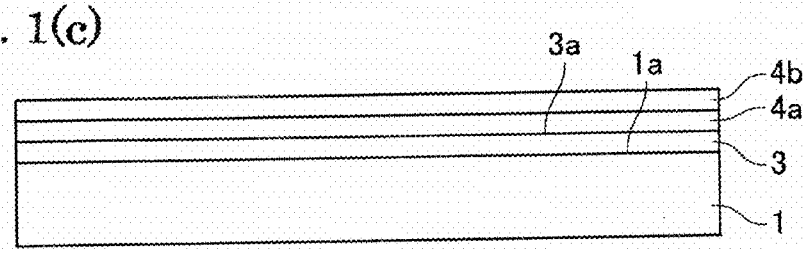

As shown in FIG. 1(a), a seed crystal film 3 is formed on a growing face 1a of a seed crystal substrate 1. Then, as shown in FIG. 1(b), a first void-depleted layer 4a is formed on a growing face 3a of the seed crystal film 3. Then, as shown in FIG. 1(c), a void-distributed layer 4b is formed on the first void-depleted layer 4a. Then, as shown in FIG. 2(a), a second void-depleted layer 4c is formed on the void-distributed layer 4b to obtain a layer 4 of a nitride of a group 13 element.

Figure 2A:
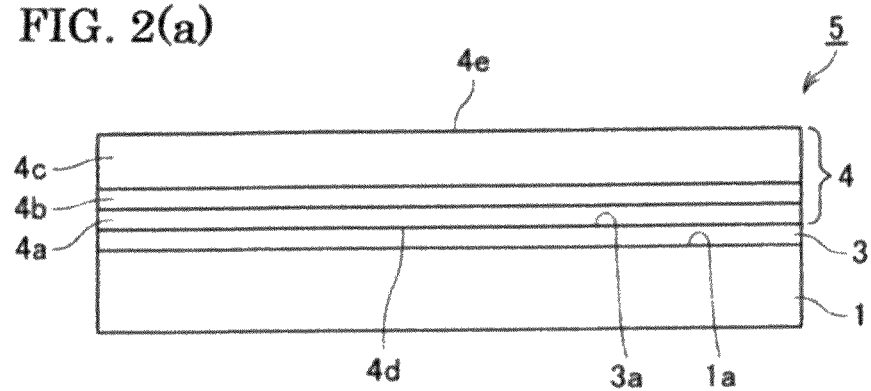
Figure 2B:
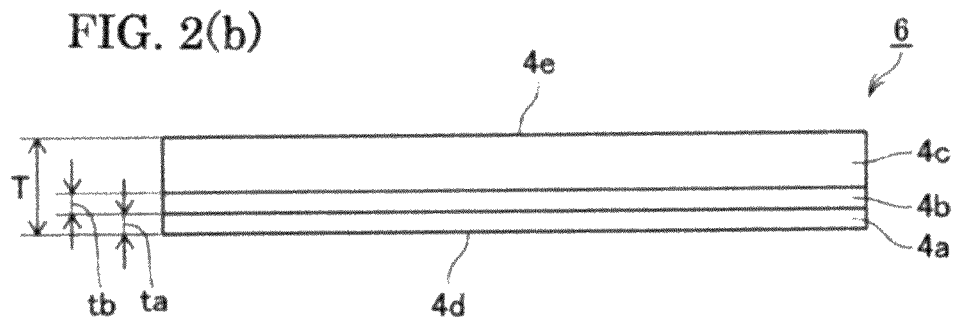

It is obtained a composite substrate 5 at the state of FIG. 2(a) and a functional device structure may be film-formed on the composite substrate 5. Alternatively, as shown in FIG. 2(b), the layer 4 of the nitride of the group 13 element may be separated from the seed crystal substrate to obtain a self-supporting substrate 6 composed of the layer of the nitride of the group 13 element. In this case, the functional device structure may be film-formed on a surface of the second void-depleted layer 4c.

The layer 4 of the nitride of the group 13 element of the present invention has a first main face 4d and second main face 4e. It further includes the first void-depleted layer 4a provided on the side of the first main face 4d, the second void depleted layer 4c provided on the side of the second main face 4e, and the void-distributed layer 4b provided between the first void-depleted layer 4a and second void-depleted layer 4c.

Each of constituents of the present invention will be further described below.

(Seed Crystal Substrate)

The seed crystal substrate may include a single crystal substrate and a seed crystal film thereon or may be composed of a self-supporting substrate made of a seed crystal.

Although a material forming the single crystal substrate is not limited, it includes sapphire, AlN template, GaN template, self-supporting GaN substrate, silicon single crystal, SiC single crystal, MgO single crystal, spinel ($MgAl_2O_4$), $LiAlO_2$, $LiGaO_2$, and perovskite composite oxides such as $LaAlO_3$, $LaGaO_3$ or $NdGaO_3$, and SCAM ($ScAlMgO_4$). A cubic perovskite composite oxide represented by the composition formula $[A_{1-y}(Sr_{1-x}Ba_x)_y][(Al_{1-z}Ga_z)_{1-u}D_u]O_3$ (wherein A is a rare earth element; D is one or more element selected from the group consisting of niobium and tantalum; y=0.3 to 0.98; x=0 to 1; z=0 to 1; u=0.15 to 0.49; and x+z=0.1 to 2) may be also used.

A material forming the seed crystal may preferably be a nitride of a group 13 element, and includes boron nitride (BN), aluminum nitride (AlN), gallium nitride (GaN), indium nitride (InN), thallium nitride (TlN) and the mixed crystals thereof (AlGaN, AlGaInN or the like).

The method of forming the seed crystal film may preferably be a vapor phase process, and metal organic chemical vapor deposition (MOCVD), hydride vapor phase epitaxy (HVPE), pulse-excited deposition (PXD), molecular beam epitaxy (MBE) and sublimation method may be listed. The organic metal chemical vapor deposition method is most preferred.

(Layer of Nitride of Group 13 Element)

The group 13 element is a group 13 element according to the Periodic Table determined by IUPAC. The group 13 element is specifically gallium, aluminum, indium, thallium or the like. Further, as an additive, it may be listed carbon, a metal having a low melting point (tin, bismuth, silver, gold), and a metal having a high melting point (a transition metal such as iron, manganese, titanium, chromium). The low-melting point metal may be added for preventing the oxidation of sodium, and the high-melting point metal may be incorporated from a container for containing a crucible or a heater in a growth furnace.

According to a preferred embodiment, the nitride of the group 13 element is gallium nitride, aluminum nitride or aluminum gallium nitride.

Voids are distributed in the nitride of the group 13 element in the void-distributed layer. The void means a space which does not include the nitride or the other incorporated component in the layer of the nitride of the group 13 element. The void referred to in the specification is to be measured as follows.

That is, the seed crystal and nitride film thereon are cut out along a cross section, and the cross-sectional surface is polished with diamond slurry having a grain size of about 1 micron. The photograph of the cross sectional surface is taken by a transmission type optical microscope at a magnification of 200. Then, a number of the voids having a size of 1 µm or more is counted in a length of 100 µm along an interface of the single crystal and layer of the nitride of the group 13 element for each of the layers.

The average size of the voids in each layer may preferably be 1.5 to 6 µm. Here, the size of each void is calculated as follows.

That is, as described above, the photograph of the cross sectional surface of the layer of the nitride of the group 13 element is taken by the transmission type electron microscope at a magnification of 200, and the length of each void in the direction perpendicular to the growing direction of each layer is measured in the photograph of the cross sectional surface, and the maximum value of the measured values is determined as the size of each void.

According to a preferred embodiment, the number of the voids with a size of 1 µm or larger per a length of 100 µm in each void-depleted layers may preferably be 1 or less, and more preferably the void with a size of 1 µm or more is not observed, on the viewpoint of the quality of the film.

According to a preferred embodiment, the number of the voids with a size of 1 μm or larger per a length of 100 μm in the void-distributed layer may preferably be 3 or more and more preferably be 5 or more, on the viewpoint of relaxing the stress and preventing the cracks. Further, on the viewpoint of film quality, the number may preferably be 15 or smaller and more preferably be 10 or smaller.

Preferably, the thickness Ta (refer to FIG. 2(b)) of the first void-depleted layer 4a is 30 μm or larger. It is thereby possible to relax the stress in the void-distributed layer 4b easily. On the viewpoint, the thickness ta of the first void-depleted layer 4a may more preferably be 50 μm or larger. Further, on the viewpoint of film quality, the thickness ta of the first void-depleted layer 4a may preferably be 150 μm or smaller and more preferably be 100 μm or smaller.

(Functional Device)

The functional device of the present invention includes:
the layer of the nitride of the group 13 element, and
a functional layer provided on the second main face.

The functional device of the present invention may be used in technical fields requiring high quality, for example, a white light LED of improved color rendering index expected as the next generation fluorescent light, a blue-violet laser disk for high-speed and high-density optical memory, an LED or laser for light source of pure blue or pure green color, and a power device for an inverter for a hybrid car or the like.

(Examples of Production Methods of Layer of Nitride of Group 13 Element)

The method of forming the layer of the nitride of the group 13 element of the present invention is not particularly limited, and liquid phase process such as flux method and vapor phase process such as metal organic chemical vapor deposition (MOCVD) method, hydride vapor phase epitaxy (HVPE) method, pulse-excited deposition (PXD) method, MBE method and sublimation method are exemplified.

Specifically, when the layer of the nitride of the group 13 element is film-formed on the seed crystal, it is selected conditions for increasing or decreasing the number of the voids in the respective layers.

It will be described an example of flux method below.

Figure 3:
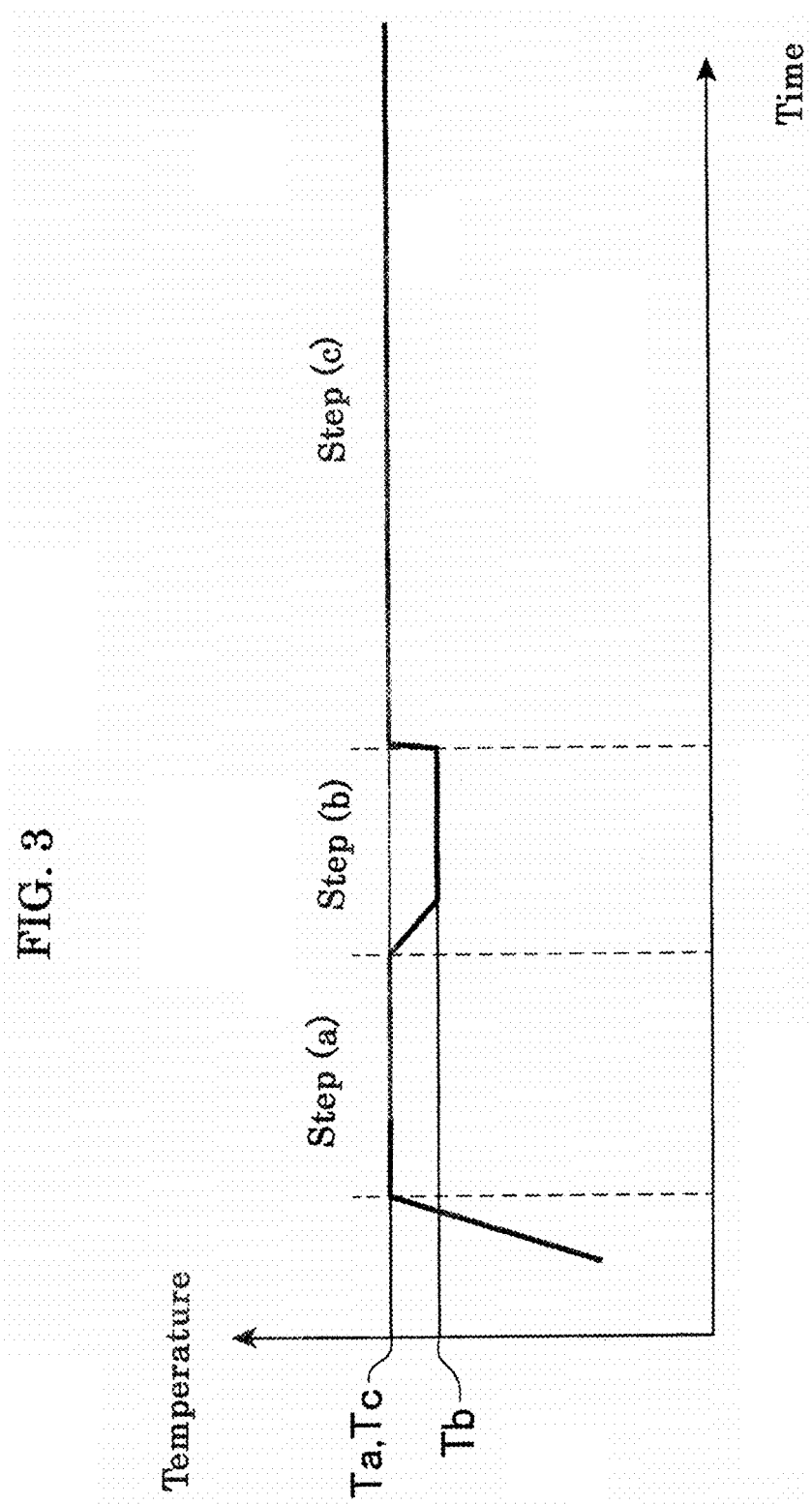
FIG. 3 shows a temperature profile usable in producing a layer of a nitride of a group 13 element of the present invention.

According to a preferred embodiment, as shown in FIG. 3, in the case that flux method is performed, temperature schedule is changed in at least three steps. Specifically, a film-forming temperature Tb in step (b) is made lower than a film-forming temperature Ta in step (a) and temperature is rapidly lowered, and film-forming temperature Tc in step (c) is then made higher than the film-forming temperature Tb in the step (b). As the film-forming temperature is raised, the film forming rate becomes lower, so that the voids tend not to be generated. As the film-forming temperature is lowered, the film-forming rate becomes higher, so that the voids tend to be generated. Such temperature schedule is thus advantageous. Further, as the temperature-descending rate from Ta to Tb is higher, the supersaturation degree in the flux is rapidly changed, so that the voids tend to be advantageously generated.

Although specific numerical values of the film-forming temperatures Ta, Tb and Tc are changed depending on the nitride of the group 13 element to be formed, the following ranges are generally preferred.

Ta and Tc: 850~900° C. (preferably 860~880° C.)
Tb: 800~850° C. (preferably 820~850° C.)
Ta-Tb and Tc-Tb: 10~50° C. (preferably 20~40° C.)

Further, the temperature descending rate from Ta to Tb may preferably be 12 to 90° C./hour, and the temperature elevation rate from Tb to Tc may preferably be 50 to 500° C./minute.

Further, the pressure during the film-formation may preferably be 3.0 to 5.0 MPa and more preferably be 3.3 to 4.5 MPa. Further, pressures PA and PC during the step (a) and step (c) may be made relatively lower and pressure PB during the step (b) may be made relatively higher to control the voids. On the viewpoint, (PB-PA) and (PB-PC) may preferably be 0.2 MPa or larger.

Further, a container containing the melt may be rotated so that it is possible to control the ease of the generation of the voids. For example, in the step (a) and step (c), the rotational rates Ra and Rc of the container may preferably be made 10 to 50 rpm. Further, in the step (b), the rotational rate Rb of the container may preferably be made 10 to 100 rpm.

Further, when the layer of the nitride of the group 13 element of the present invention is generated, it is preferred to stop the rotation of the container. In this case, a time period of stopping the rotation may preferably be 1 second to 6000 seconds, and more preferably be 10 seconds to 3600 seconds. Further, time periods of the rotation before and after the stopping of the rotation may preferably be 10 seconds to 3600 seconds.

A ratio (molar ratio) of the group 13 element/flux (for example, sodium) in the melt may preferably be higher, more preferably be 18 mol % or higher and most preferably be 25 mol % or higher, on the viewpoint of the present invention. The generation of the voids can be facilitated by elevating the ratio. However, as the ratio becomes too large, the crystal quality tends to be deteriorated, so that the ratio may preferably be 40 mol % or lower.

EXAMPLES

Inventive Example 1

The gallium nitride crystal layer was grown according to the method described referring to FIGS. 1 to 3.

Specifically, it was epitaxially grown a seed crystal film 3 of gallium nitride having a thickness of 5 microns on a c-plane sapphire body having a diameter of 3 inches and thickness of 0.25 mm by MOCVD method to produce so-called GaN template (FIG. 1(a)).

The seed crystal layer 4 was then grown on the seed crystal film 3 by flux method.

Specifically, it was used a cylindrical crucible with a flat bottom with an inner diameter of 80 mm and a height of 45 mm, materials for growth (Ga metal 60 g and Na metal 60 g) were molten in a glove box and then filled into the crucible. Na was filled in advance and Ga was filled thereafter, so that Na was shielded from an atmosphere to prevent the oxidation of Na. The height of the melt of the materials in the crucible was about 15 mm.

The crucible was contained and sealed in a container of a heat-resistant metal, and the container was then mounted on a rotatable table in a crystal growth furnace. The temperature and pressure were elevated to 870° C. and 4.5 MPa and maintained for 5 hours, while the melt was agitated by rotation to perform the crystal growth (step (a)). The rotation was performed under the following conditions.

Rotational rate: 10 rpm
Rotation time period: 600 seconds
Rotation stopping time period: 600 seconds The temperature was then lowered to 840° C. over 1 hour (at a temperature descending rate of 30° C./hour), and held for 3 hours (step (b)). The temperature was then raised to 870° C. again (at a temperature ascending rate of 300° C./hour) and crystal growth was performed for 92 hours (step (c)). It was gradually cooled to room temperature over 10 hours.

Figure 4:
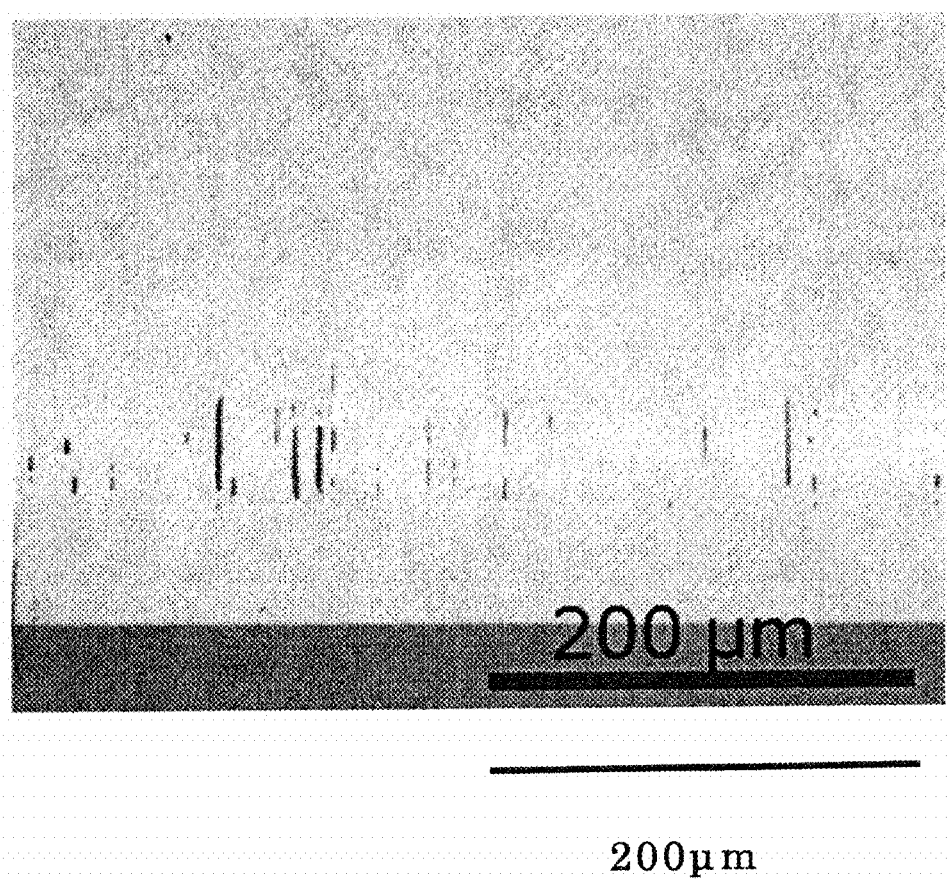
FIG. 4 is a photograph taken by a microscope of the layer of a nitride of a group 13 element obtained by the inventive example.
Figure 5:
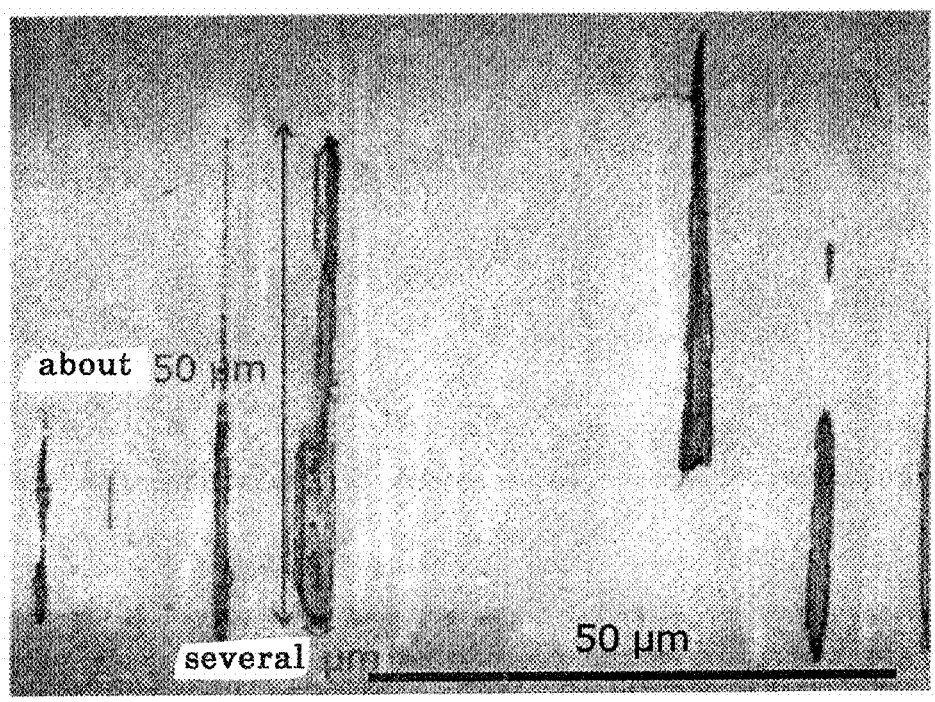
FIG. 5 shows a photograph enlarging a part of FIG. 4.

The thus grown crystal was grown in a thickness of 1.3 mm. The deviation in a plane was small and less than 10%. The photographs of the cross section of the thus obtained crystal were shown in FIGS. 4 and 5. When it is viewed from the direction of the cross section, it was observed three-layered structure including a first void-depleted layer, void-distributed layer and a second void-depleted layer view from the side of the sapphire substrate 1.

The structures of the respective layers are as follows.

First Void-Depleted Layer:
  Thickness: 65 µm
  Number of voids per a length of 100 µm: 0

Void-Distributed Layer:
  Thickness: 50 µm
  Number of voids per a length of 100 µm: 5
  Size of voids (average value): 2 µm Second Void-Depleted Layer:
  Number of voids per a length of 100 µm: 0

Total thickness of nitride layer of group 13 element: 1.3 mm 10 bodies of the nitride layers of the group 13 element described above were formed, and the number of the occurrence of the cracks after the growth was examined. The rate of the crack generation was proved to be 0 percent.

Further, the respective nitride layers of the group 13 element were separated from the sapphire substrates by laser lift-off method. The experiments were repeated 10 times and the rate of crack generation in the layer of the nitride of the group 13 element was proved to be 0 percent.

Inventive Examples 2 to 7

The nitride layers of the group 13 element according to the respective examples were film-formed.

However, the respective condition of the steps (a), (b) and (c) were changed as shown in table 1.

The structure of each layer of the thus obtained nitride layers of the group 13 element was shown in table 2. Further, in the thus obtained nitride layers of the group 13 element of the respective examples, the presence or absence of the cracks in each nitride layer of the group 13 element was observed after the growth and separation by laser lift-off method. The results were shown in table 2.

TABLE 1

| | Step (a) | | | | | Step (b) | | | | | | Step(c) | | | | |
|---|---|---|---|---|---|---|---|---|---|---|---|---|---|---|---|---|
| | Temp. ° C. | Time hrs | Rotation rate rpm | Rotation time sec | Stopping time sec | Temp. Descendent rate ° C./hrs | Temp. ° C. | time hrs | rotation rate rpm | rotation time sec | stopping time sec | Temp. ° C. | time hrs | rotation rate rpm | rotation time sec | stopping time sec |
| Ex. 1 | 870 | 5 | 10 | 600 | 600 | 30 | 840 | 3 | 10 | 600 | 600 | 870 | 92 | 10 | 600 | 600 |
| Ex. 2 | 870 | 10 | 10 | 600 | 600 | 30 | 840 | 3 | 10 | 600 | 600 | 870 | 87 | 10 | 600 | 600 |
| Ex. 3 | 870 | 5 | 10 | 600 | 600 | 12 | 840 | 3 | 10 | 600 | 600 | 870 | 92 | 10 | 600 | 600 |
| Ex. 4 | 870 | 5 | 10 | 600 | 600 | 60 | 840 | 3 | 10 | 600 | 600 | 870 | 92 | 10 | 600 | 600 |
| Ex. 5 | 870 | 5 | 10 | 600 | 600 | 90 | 840 | 3 | 10 | 600 | 600 | 870 | 92 | 10 | 600 | 600 |
| Ex. 6 | 870 | 5 | 10 | 600 | 600 | 30 | 840 | 2 | 10 | 600 | 600 | 870 | 93 | 10 | 600 | 600 |
| Ex. 7 | 870 | 5 | 10 | 600 | 600 | 30 | 840 | 6 | 10 | 600 | 600 | 870 | 89 | 10 | 600 | 600 |
| Com. Ex. 1 | 870 | 100 | 10 | 600 | 600 | — | — | — | — | — | — | — | — | — | — | — |
| Com. Ex. 2 | 870 | 2 | 60 | 10 | 10 | — | 870 | 98 | 10 | 600 | 600 | — | — | — | — | — |

TABLE 2

| | First void-depleted layer | | Void-distributed layer | | | Second void-depleted layer | Occurrence of cracks | |
|---|---|---|---|---|---|---|---|---|
| | Thickness (Ta) µm | Number of voids counts/100 µm | Average size µm | Thickness (Tb) µm | Number of voids counts/100 µm | Number of voids counts/100 µm | Direct after growth % | after separation % |
| Ex. 1 | 65 | 0 | 2 | 50 | 5 | 0 | 0 | 0 |
| Ex. 2 | 130 | 0 | 2 | 50 | 5 | 0 | 0 | 0 |
| Ex. 3 | 65 | 0 | 1.5 | 50 | 3 | 0 | 10 | 0 |
| Ex. 4 | 65 | 0 | 4 | 60 | 5 | 0 | 0 | 0 |
| Ex. 5 | 65 | 0 | 6 | 70 | 5 | 1 | 0 | 10 |
| Ex. 6 | 65 | 0 | 2 | 30 | 5 | 0 | 10 | 0 |
| Ex. 7 | 65 | 0 | 2 | 100 | 5 | 0 | 0 | 10 |
| Com. Ex. 1 | 1300 | 0 | — | — | — | — | 40 | 40 |
| Com. Ex. 2 | — | — | 1 | 20 | 10 | 0 | 20 | 30 |

Comparative Example 1

Gallium nitride crystal layer was grown according to the method described referring to FIGS. 1 and 2.

Specifically, it was produced the GaN template same as that in the inventive example 1 (FIG. 1(a)).

It was then grown gallium nitride single crystal layer on the seed crystal film 3 by flux method.

Specifically, it was used a cylindrical crucible with a flat bottom having an inner diameter of 80 mm and a height of 45 mm, and materials for growth (Ga metal 60 g and Na metal 60 g) were molten in a glove box and filled in the crucible. Na was filled first and Ga was subsequently filled, so that Na is shielded from atmosphere to prevent the oxidation. The height of the melt of the materials in the crucible was about 15 mm.

The crucible was contained and sealed in a container composed of a heat-resistant metal, and the container was then mounted on a rotatable table in a crystal growth furnace. The temperature and pressure were elevated to 870° C. and 4.5 MPa and maintained for 100 hours for the crystal growth, while the melt was agitated by rotation to perform the crystal growth step. The rotation was performed under the following conditions.

Rotational rate: 10 rpm
Rotation time period: 600 seconds
Rotation stopping time period: 600 seconds The thus grown crystal was grown in a thickness of 1.3 mm. The deviation in a plane was small and less than 10%. As the photograph of the cross section of the thus obtained crystal was observed, it was observed a single-layered structure viewed from the side of the sapphire substrate. The structure of the layer was as follows.

Thickness: 1.3 mm
Number of voids per a length of 100 μm: 0

10 bodies of the nitride layers of the group 13 element described above were formed, and the number of the occurrence of the cracks after the growth was examined. The rate of the crack generation was proved to be 40 percent.

Further, the respective nitride layers of the group 13 element were separated from the sapphire substrates by laser lift-off method. The experiments were repeated 10 times and the rate of crack generation in the nitride layer of the group 13 element was proved to be 40 percent.

Comparative Example 2

Gallium nitride crystal layer was grown according to the method described referring to FIGS. 1 and 2.

Specifically, it was produced the GaN template same as that in the inventive example 1 (FIG. 1(a)).

It was then grown gallium nitride single crystal layer 4 on the seed crystal film 3 by flux method.

Specifically, it was used a cylindrical crucible with a flat bottom having an inner diameter of 80 mm and a height of 45 mm, and materials for growth (Ga metal 60 g and Na metal 60 g) were molten in a glove box and filled in the crucible. Na was filled first and Ga was subsequently filled, so that Na is shielded from atmosphere to prevent the oxidation. The height of the melt of the material in the crucible was about 15 mm.

The crucible was contained and sealed in a container composed of a heat-resistant metal, and the container was then mounted on a rotatable table in a crystal growth furnace. The temperature and pressure were elevated to 870° C. and 4.5 MPa and maintained for 2 hours for the crystal growth. The rotation was performed under the following conditions.

Rotational rate: 60 rpm
Rotation time period: 10 seconds
Rotation stopping time period: 10 seconds Then, the conditions of the rotation were changed as follows while the conditions of 870° C. and 4.5 MPa were maintained and held for 98 hours to grow crystal.

Rotational rate: 10 rpm
Rotation time period: 600 seconds
Rotation stopping time period: 600 seconds The thus grown crystal was grown in a thickness of 1.3 mm. The deviation in a plane was small and less than 10%. As the photograph of the cross section of the thus obtained crystal was observed, it was observed a two-layered structure, viewed from the side of the sapphire substrate.

The structures of the layers was as follows.
Void-Distributed Layer:
Thickness: 20 mm
Number of voids per a length of 100 μm: 10
Void-Depleted Layer
Number of voids per a length of 100 μm: 0
Total thickness of nitride layer of group 13 element: 1.3 mm 10 bodies of the nitride layers of the group 13 element described above were formed, and the number of the occurrence of the cracks after the growth was examined. The rate of the crack generation was proved to be 20 percent.

Further, the respective nitride layers of the group 13 element were separated from the sapphire substrate by laser lift-off method. The experiments were repeated 10 times and the rate of crack generation was proved to be 30 percent.

The invention claimed is:

1. A composite substrate comprising:
    a single crystal substrate;
    a seed crystal film provided on said single crystal substrate; and
    a layer of a crystal of a group 13 element provided on a flat surface of said seed crystal film,
    wherein said layer of said crystal of said group 13 element has a first main face and a second main face, and wherein said layer comprises a first void-depleted layer provided on a side of said first main face, a second void-depleted layer provided on a side of said second main face, and a void-distributed layer provided between said first void-depleted layer and second void-depleted layer, and
    wherein said seed crystal film contacts said first main face of said layer of said crystal of said group 13 element.

2. The composite substrate of claim 1, wherein said layer of said crystal of said group 13 element comprises gallium nitride, aluminum nitride or aluminum gallium nitride.

3. The composite substrate of claim 1, wherein said first void-depleted layer has a thickness in a range of 30 μm to 100 μm.

4. The composite substrate of claim 1, wherein each of said first void-depleted layer and said second void-depleted layer has a number of voids of 1 or less per a length of 100 μm, and wherein said void distributed layer has a number of voids in a range of 3 to 10 per a length of 100 μm.

5. A functional device comprising:
    said composite substrate of claim 1; and
    a functional layer provided on said second main face of said layer of said crystal of said group 13 element.

6. The functional device of claim 5, wherein said functional layer has a function of emitting a light.

7. The functional device of claim 5, further comprising a seed crystal substrate, wherein said layer of said crystal of said group 13 element is provided on said seed crystal substrate.

8. The functional device of claim 7, wherein said seed crystal substrate comprises a single crystal substrate and said seed crystal film provided on said seed crystal substrate.

* * * * *